(12) United States Patent
Arthanari et al.

(10) Patent No.: US 7,454,735 B2
(45) Date of Patent: Nov. 18, 2008

(54) ASIC CLOCK FLOOR PLANNING METHOD AND STRUCTURE

(75) Inventors: Geetha Arthanari, Essex Junction, VT (US); Keith M. Carrig, Essex Junction, VT (US); Mark R. Lasher, Colchester, VT (US); Daniel R. Menard, Arlington, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/539,334

(22) PCT Filed: Dec. 17, 2002

(86) PCT No.: PCT/US02/40428

§ 371 (c)(1),
(2), (4) Date: Jun. 15, 2005

(87) PCT Pub. No.: WO2004/061724

PCT Pub. Date: Jul. 22, 2004

(65) Prior Publication Data

US 2006/0031699 A1 Feb. 9, 2006

(51) Int. Cl.
*G06F 17/50* (2006.01)
(52) U.S. Cl. .................... 716/13; 716/6; 716/8; 716/10
(58) Field of Classification Search .................. 716/13, 716/17, 6, 8, 10; 257/208
See application file for complete search history.

(56) References Cited

U.S. PATENT DOCUMENTS

| | | | |
|---|---|---|---|
| 5,339,253 A * | 8/1994 | Carrig et al. .................... 716/6 |
| 5,610,833 A | 3/1997 | Chang et al. | |
| 5,696,693 A | 12/1997 | Aubel et al. | |
| 5,774,371 A | 6/1998 | Kawakami | |
| 5,787,268 A | 7/1998 | Sugiyama et al. | |
| 5,790,841 A | 8/1998 | Scherer et al. | |
| 5,838,581 A | 11/1998 | Kuroda | |
| 5,849,610 A * | 12/1998 | Zhu ............................ 438/129 |
| 5,866,924 A * | 2/1999 | Zhu ............................ 257/208 |
| 5,917,729 A | 6/1999 | Naganuma et al. | |
| 5,963,728 A * | 10/1999 | Hathaway et al. .............. 716/3 |
| 6,204,713 B1 | 3/2001 | Adams et al. | |

(Continued)

FOREIGN PATENT DOCUMENTS

JP         8044776         2/1996

(Continued)

OTHER PUBLICATIONS

Abstrt 571, JP, filed May 5, 1996.

(Continued)

*Primary Examiner*—Paul Dinh
*Assistant Examiner*—Suchin Parihar
(74) *Attorney, Agent, or Firm*—Joseph P. Abate

(57) ABSTRACT

A method of designing a clock tree in an integrated circuit combines steps of making a list of all clock sinks; positioning a temporary reference insertion point (TIP); grouping the sinks together with structured clock buffers (SCBs) in a set of levels; and moving the SCBs to improve symmetry of the tree. The SCBs may be of several sizes and may be positioned horizontally or vertically and moved within limits to permit the program to calculate a complete tree.

8 Claims, 6 Drawing Sheets

U.S. PATENT DOCUMENTS

| | | | |
|---|---|---|---|
| 6,223,329 | B1 | 4/2001 | Ling et al. |
| 6,266,803 | B1 | 7/2001 | Scherer et al. |
| 6,324,678 | B1 | 11/2001 | Dangelo et al. |
| 6,331,790 | B1 | 12/2001 | Or-Bach et al. |
| 6,421,818 | B1 | 7/2002 | Dupenloup et al. |
| 6,467,074 | B1 | 10/2002 | Katsioulas et al. |
| 6,480,994 | B1 * | 11/2002 | Tetelbaum et al. ............ 716/10 |
| 6,513,149 | B1 | 1/2003 | Donato |
| 6,536,024 | B1 * | 3/2003 | Hathaway ...................... 716/6 |
| 6,536,028 | B1 | 3/2003 | Katsioulas et al. |
| 6,609,228 | B1 * | 8/2003 | Bergeron et al. ............... 716/2 |
| 6,681,373 | B1 | 1/2004 | Zolotykh et al. |
| 6,701,504 | B2 | 3/2004 | Chang et al. |
| 6,834,380 | B2 | 12/2004 | Khazei |
| 6,857,107 | B2 | 2/2005 | Nagasaka et al. |
| 7,036,104 | B1 * | 4/2006 | Alpert et al. .................. 716/10 |
| 7,051,310 | B2 * | 5/2006 | Tsao et al. .................... 716/10 |
| 2001/0025368 | A1 | 9/2001 | Cooke et al. |
| 2001/0028265 | A1 | 10/2001 | Nitta |
| 2003/0101331 | A1 | 5/2003 | Boylan et al. |
| 2003/0135836 | A1 * | 7/2003 | Chang et al. .................. 716/11 |
| 2004/0068626 | A1 * | 4/2004 | Alpert et al. ................. 711/158 |
| 2004/0225984 | A1 * | 11/2004 | Tsao et al. .................... 716/10 |
| 2005/0138578 | A1 * | 6/2005 | Alpert et al. ................... 716/2 |

FOREIGN PATENT DOCUMENTS

| | | |
|---|---|---|
| JP | 8129571 | 5/1996 |
| JP | 2001125037 | 5/2001 |
| WO | WO 2004/061724 A1 | 7/2004 |

OTHER PUBLICATIONS

Abstrt 037, JP, filed May 11, 2001.

Abstrt 776, JP, filed Feb. 16, 1996.

S. Suminaga - Clock-Skew Compensation Mechanism for Large Scale Integration - IBM Technical Disclosure Bulletin - vol. 38, No. 8, Aug. 1995 - pp. 141-142.

Keith M. Carrig, et al - A Clock Methodology for High-Performance Microprocessors - Journal of VLSI Signal Processing (1997) - pp. 105-111.

Ann Marie Rincon, et al. - "A Proven Methodology for Designing One-Million-Gate ASICs" - IEEE 1996 Custom Integrated Circuits Conference - pp. 45-52.

* cited by examiner

ASIC CLOCK FLOOR PLANNING METHOD AND STRUCTURE

TECHNICAL FIELD

The field of the invention is that of designing and constructing a clock tree in an integrated circuit.

BACKGROUND ART

In the field of integrated circuits, a constant need is that of distributing the clock signal. As clock speeds have increased, the tolerances on clock skew have tightened.

A number of commercial products are on the market to assist in the design process. Cadence offers a program, Clock Tree Synthesis™, which generates a tree with limits on the size of a buffer and/or on the complexity of the floor plan that the tree can accommodate. Synopsis offers a program, Clock Tree Compiler™ that is generally similar.

IBM has a program, using a method described in U.S. Pat. No. 6,204,713, which can handle large buffers, which permits a tree with fewer levels.

The problem in generating clock trees can be described generally as striking a balance between delay, power consumed and ability to accommodate circuit blocks that have had their designs frozen. A short delay in the clock chain helps control skew. Low power is always desirable and the ability to reuse predesigned circuit blocks (embedded processors, RAMs, I/O, etc.) without redoing the layout to accommodate the clock saves greatly on cost in developing an ASIC.

DISCLOSURE OF THE INVENTION

The invention relates to a method of designing a clock tree that accommodates an existing layout while selecting clock buffer size and orientation to match the floorplan.

Accordingly, a method and corresponding article of manufacture are provided for designing a clock tree in an integrated circuit comprising:

collecting a set of sink locations 3 in a master list and a set of blocked areas 47;

(a) selecting a temporary insertion point (TIP) 4, 5;

(b) enclosing the sink 41 at the first level furthest from the TIP in a bin 40 that includes a first subset of sinks 43 and remove the first subset from the master list;

(c) assigning a first-level structured clock buffer (SCB) 42 to the bin;

repeating steps (a), (b) and (c) above for the remaining sinks in the first level of buffers and subsequent levels until the root level is reached;

improving the symmetry of the tree by moving SCB 45 locations within constraints 46 to concentrate SCBs in rows and columns;

connecting the root level TIP 610 to lower levels; and connecting a source (S) of clock signals to the root level TIP.

BEST MODE FOR CARRYING OUT THE INVENTION

The invention is intended to be used in the design of integrated circuits, especially ASICs, where a short design process is an important part of keeping costs down. In the course of designing large-scale (30,000,000+ gates) ASICs, the process of routing the clock tree around the pre-designed modules that form the bulk of the ASIC consumes a significant amount of time and cost.

Among advantages that may arise by application of the invention are the following:

automatic or manual selection of a reference point (or temporary insertion point (TIP)) that starts the branching process;

flexibility in range and aspect ratio of buffers;

choice of either one or both of top-down or bottom-up methods;

provision of trees having buffers of different sizes;

allowance for the user to intervene in the design;

The sequence of steps according to a preferred embodiment of the invention is:

collect the clock sink locations and blockage dimensions.

pick the TIP for the lowest (leaf) level group the sinks in bins, starting with the one furthest from the TIP and place a first-level buffer in each bin pick a TIP for the first level group the first-level buffers in bins, starting with the one furthest from the TIP and place a second-level buffer in each bin repeat the TIP selection and binning step until the root level is reached improve the symmetry by moving buffers within constraints to concentrate buffers in rows and columns add buffers from the source to the TIP, and insert the tree in the netlist.

Figure 1:
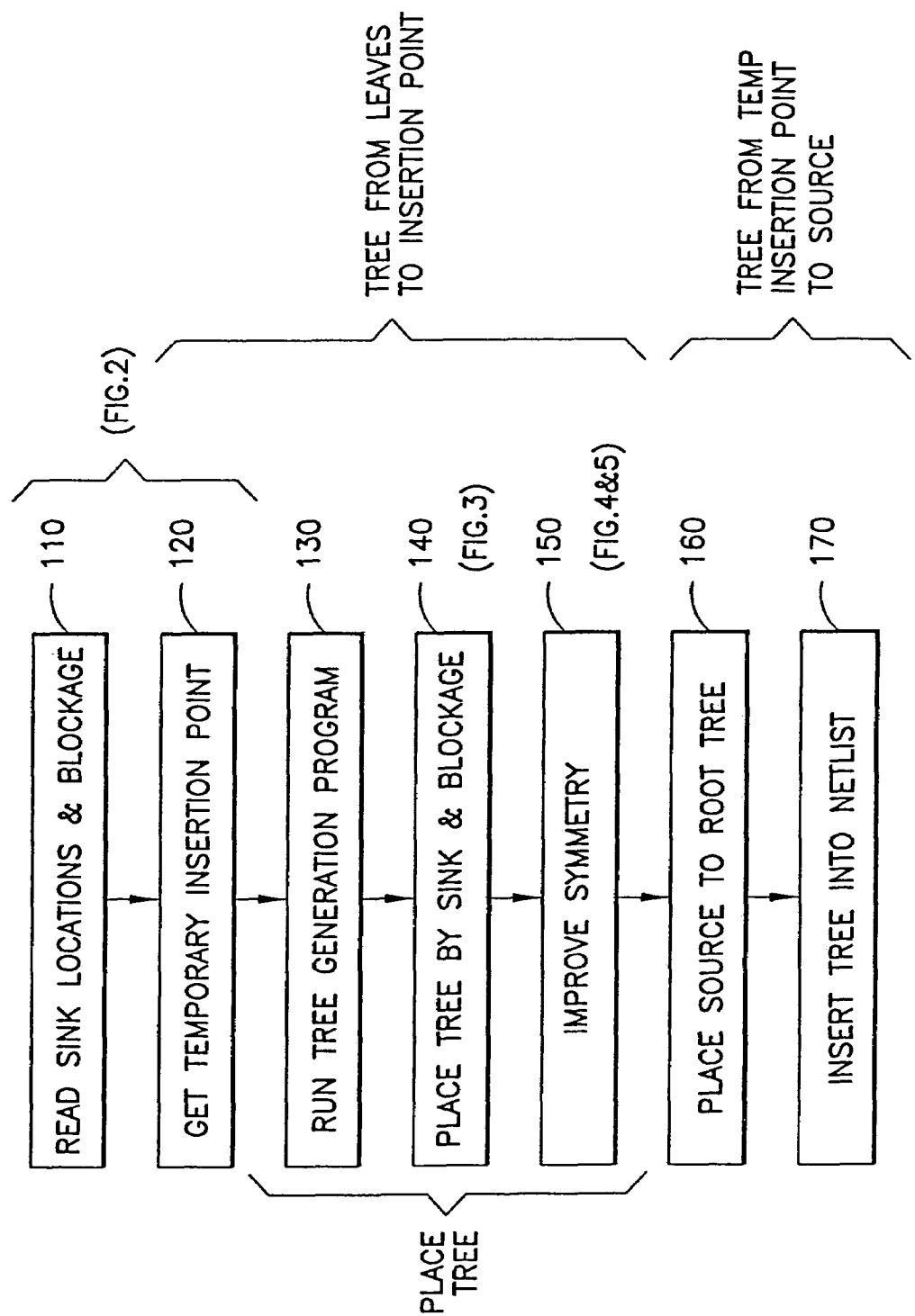
FIG. 1 lists steps in a preferred embodiment of the invention.
Figure 2:
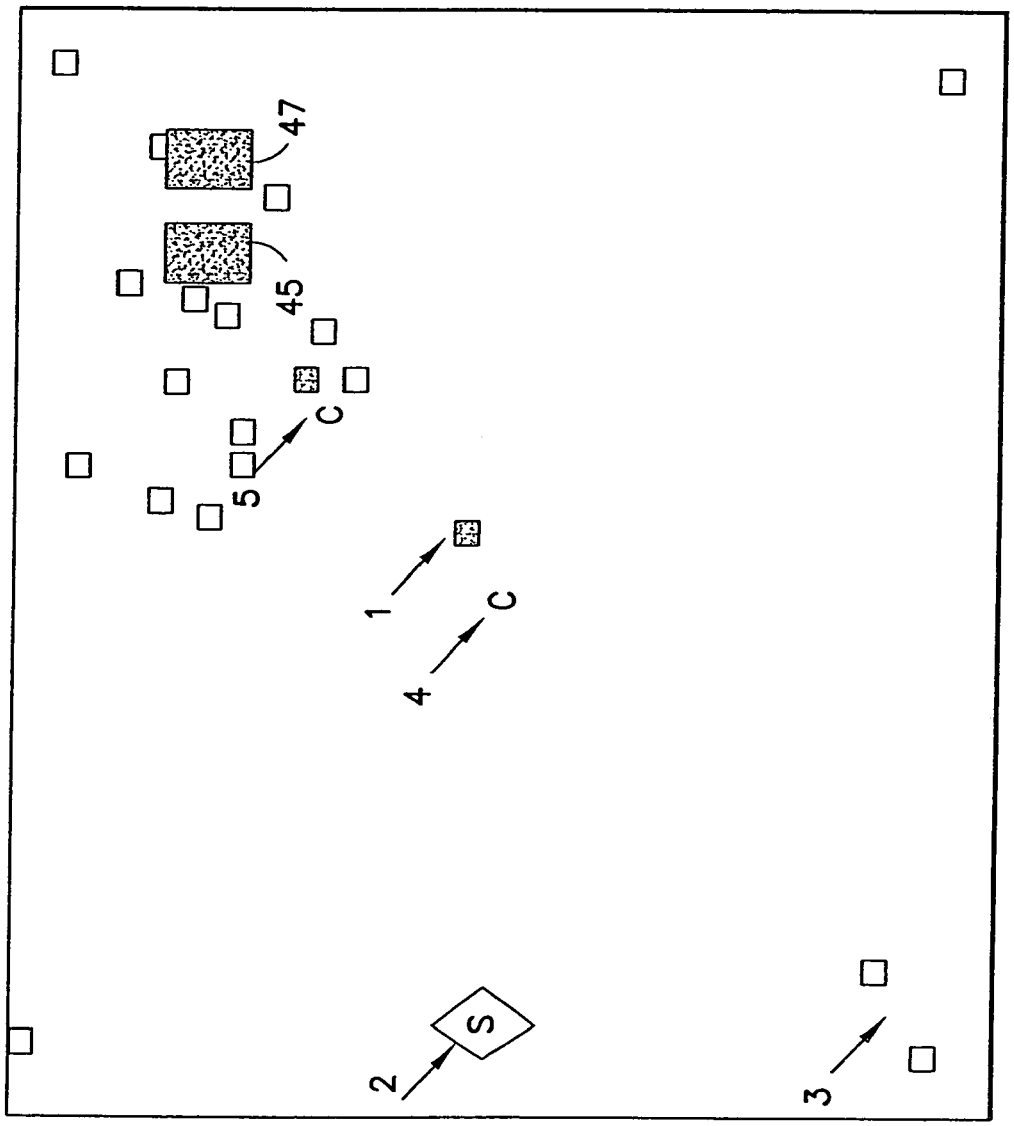
FIG. 2 shows a sample set of sink locations.

FIG. 2 illustrates a simplified example of an integrated circuit being processed according to the invention. At the center of the figure, filled rectangle 1 represents the TIP. Hollow rectangles 3 represent clock sinks, which is a general term for the interface between the tree and the logic. The logic surrounding the interface points is omitted for clarity in presentation. The diamond on the left side represents the source of the clock signals. Capital C, 4, represents a point calculated by taking the mean between the extreme coordinates of all the sinks—e.g. x=(xmax+xmin)/2 and y=(ymax+ymin)/2. The capital C', 5, represents the centroid calculated by taking the mean of all the sink coordinates. These sinks will be grouped and assigned to a buffer that distributes the clock signal.

Buffers according to the invention, referred to as structured clock buffers (SCBs) are circuits built of N parallel kernels along an axis, where N is greater than or equal to one. These buffers can be inverting or Non-Inverting. Outputs of the kernel are tied together. Balanced wiring is used to wire the circuits of the Structured Clock Buffers. U.S. Pat. No. 6,204,713, incorporated by reference, explains the design and construction of such buffers.

It is an advantageous feature of the invention that the buffers are not restricted to a layout along a single axis (horizontal or vertical) but that layout along both axes may be provided, in order to permit a buffer to fit in a limited space. As those skilled in the art are aware, circuit layout is conventionally done with the axis of the transistors lined with one of the coordinate directions.

Designing a vertical buffer that fits within a layout that was intended to be horizontal is non-trivial and requires that the transistors in the vertical SCBs must be in same orientation as the horizontal SCBs. In addition, balanced wiring is needed for both orientations. Power rings are needed for either the vertical or horizontal SCB to account for differences in the vertical or horizontal power distribution. This may require an additional wiring level for vertical or horizontal SCBs in order to fit in additional wires. Layouts are modified so that each horizontal SCB has a delay and output drive capability that match a corresponding vertical SCB.

The TIP can be calculated automatically by calculating the delay, power and placability at the center of the sinks (C), the centroid of the sinks (C') and at a set of intermediate points between C and C'. The selection rule is summarized as: If the center of the sinks is closer to the source than the centroid is, then the TIP is placed at the center. If there is a block (a module that cannot be re-drawn) at the center, then the TIP is placed at a different location, either the centroid or at one of the intermediate points between the center and the centroid.

The placability algorithm produces a result of zero if the location is blocked. The best score is generated by an unblocked location large enough for the SCB, and closest to the desired placement point. The score decreases as the distance from the desired point increases, reflecting the undesirability of additional distance.

The TIP point can be determined by calculating a score that is the sum $S1W1+S2W2+S3W3$, where $S1$, $S2$ and $S3$ are 0 or 1, depending on which aspect the designer wishes to emphasize and $W1=K1*Delay$, $W2=K2*Power$ and $W3=K3*Placability$, where $Ki$ is determined empirically Once the TIP has been placed, the sinks at the lowest level of the clock tree are grouped. A rectangle (bin) is placed, just enclosing the sink farthest from the TIP. The initial size of the bin is set empirically, based on experience with the density of sinks. The bin may be adjusted up or down to approach the desired size. Illustratively, a bin holding about 20 The actual number is determined by the drive capability of the SCB and the wiring delays to get to the sinks.

Similarly, the number of levels in the tree will be set empirically, e.g. at three. Again the actual number is determined by the drive capability of the SCB and the wiring delay's to get to the sinks. More levels can be added for larger trees.

A buffer is placed at the center of the rectangle, which may be moved slightly in the x and/or y directions to accommodate the maximum number of sinks. The size of the buffer is set to be able to drive the sinks in the bin. It is an advantageous feature of the invention that the size of the buffers may be selected from a set of pre-designed buffers in order to drive the number of sinks that happen to be in the bin, rather than cutting down the size of the bin to accommodate the buffer. The sinks included in that bin are deleted from the master list of sinks and the next bin is placed.

Figure 3:
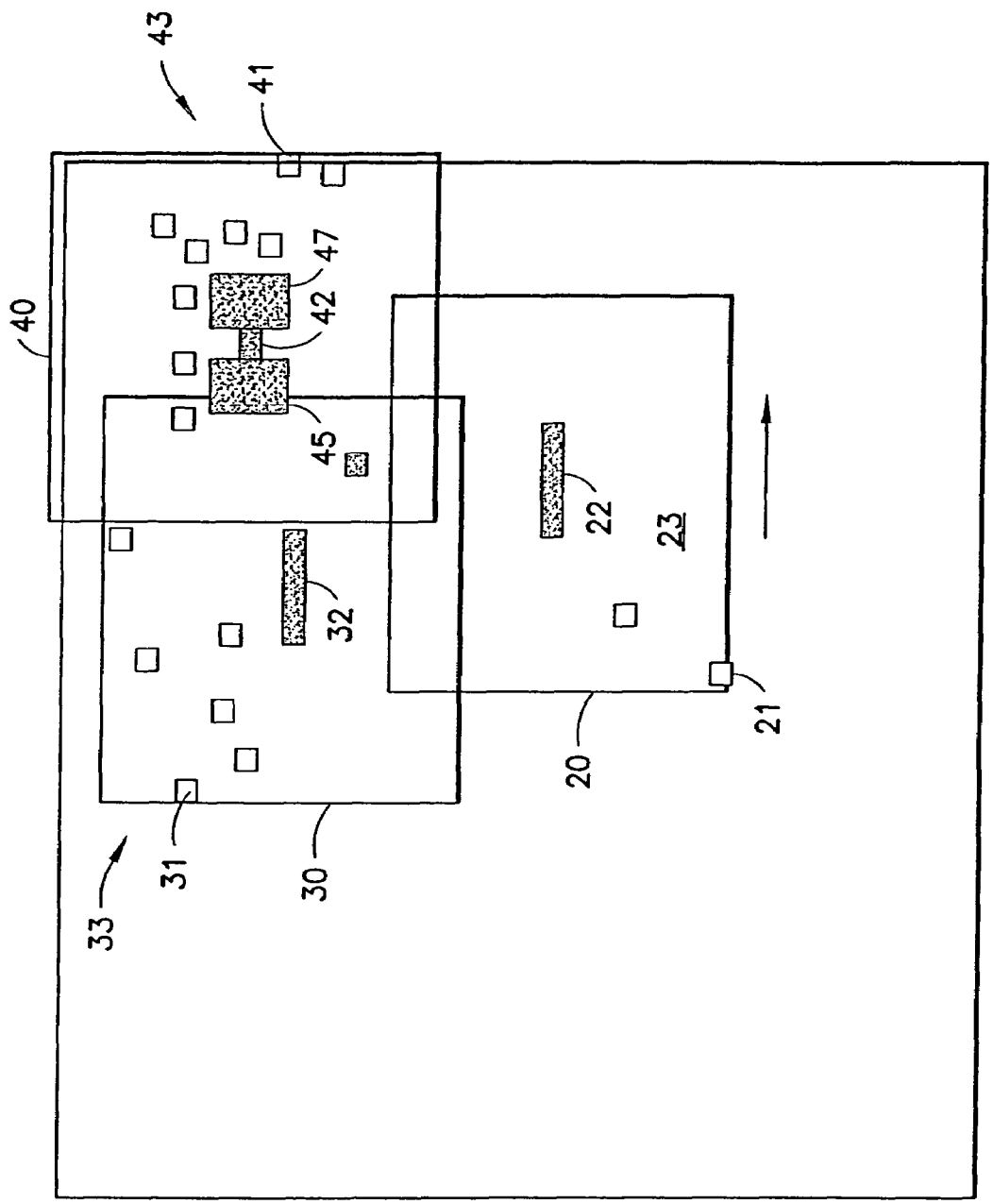
FIG. 3 shows an example of grouping the sinks in bins served by a buffer.

FIG. 3 has been drawn to illustrate a situation in which a pair of modules 45 and 47 are located such that a horizontal buffer will not fit. According to the invention, the buffer is moved toward the TIP to try to find a location that fits and still permits the buffer to drive the sinks. If such a location is not found, a vertical buffer is placed. If a vertical buffer will not fit, the program places a horizontal buffer in the original location, even if it is overlapping fixed blocks, printing a warning message for the user to correct it manually. Such a situation is illustrated with buffer 42. The sequence is that the program will exhaust the possibilities in the horizontal, and then exhaust the possibilities in the vertical then warn the user if no placement is possible.

Referring now to FIG. 3, there is shown a set of three SCB areas represented by boxes 20, 30 and 40 holding sink subsets 23, 33 and 43 and positioned around SCBs 22, 32 and 42, respectively. The dimensions of a box represent the distance over which a clock signal can be transmitted by the SCB at the center of the box within the restrictions on skew, etc. set by the circuit designer. Illustratively, the boxes have been shifted to have a boundary that is next to the extreme position of a sink—i.e. box 20 has been placed so that the sink 21, furthest from the TIP is at its edge; similarly for box 30 and sink 31 and for box 40 and sink 41.

According to the invention, the size of the SCB will be set to drive the sinks within its range. It is an advantageous feature of the invention that the size of a buffer is flexible.

Once the first bin is set, the sink remaining in the master list that is furthest from the TIP is located and a bin is placed enclosing it. The preceding procedure is repeated until all the sinks have been placed in bins. This covers the leaf level of the clock tree.

The binning procedure is repeated, using first and second level buffers in place of leaf-level sinks, until the root level of the tree is reached.

Figure 4:
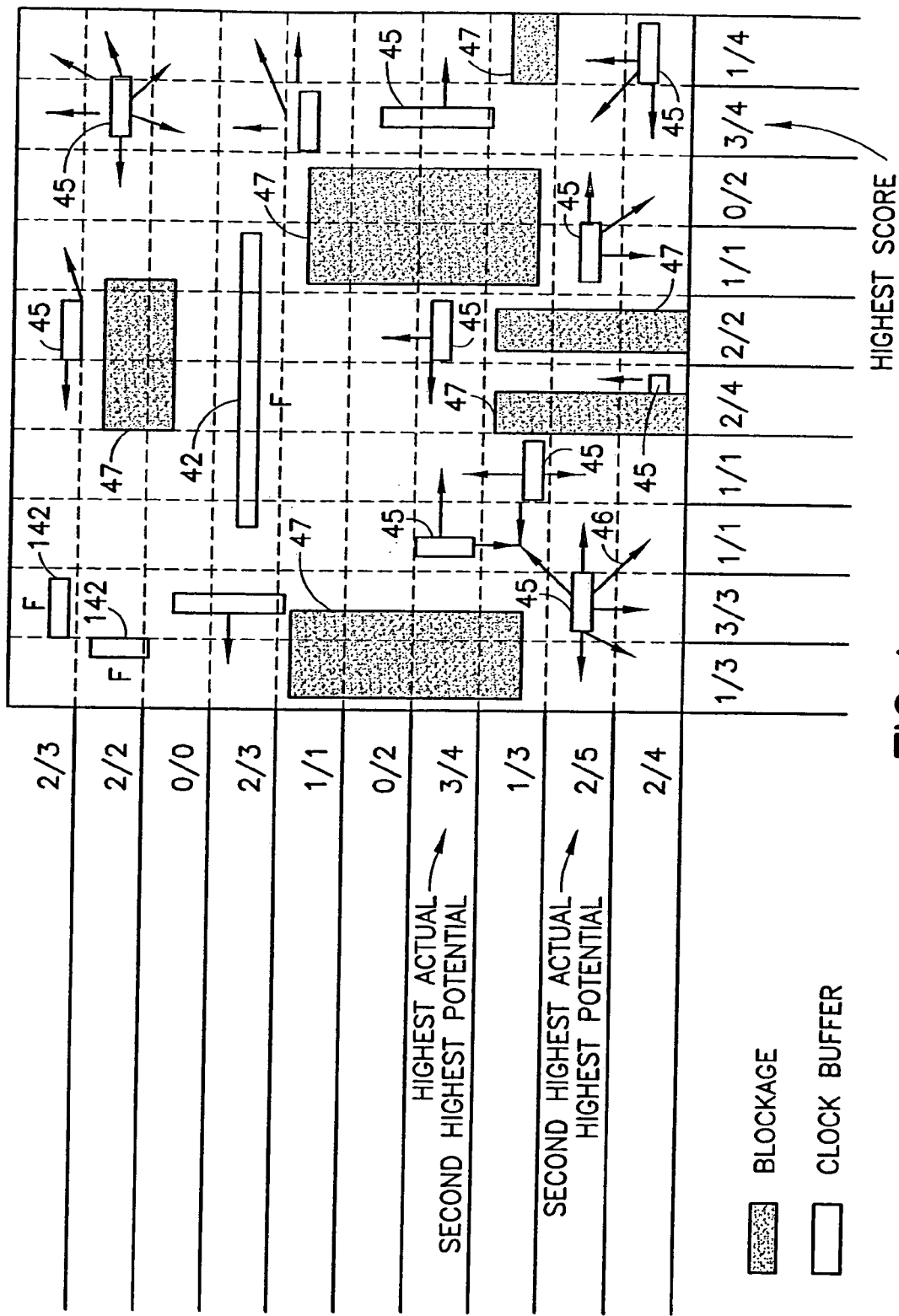
FIGS. 4 and 5 show initial and final locations of a set of buffers.

Once the sinks have been allocated to SCBs, a process of improving the symmetry of the tree can be performed. FIG. 4 shows a simplified example of a layout in which three SCBs 142, have been fixed for one reason or another and will not be moved in this step. Examples of a fixed SCB may be a customer pre-placing and assigning one SCB to some high speed critical circuits (i.e. high speed interface). Another case might be one where part of the chip already meets the timing requirements and the customer does not wish to revisit the compromises made to get that result.

Blocks 47 represent layout modules that will not be moved. The clock tree must be routed around them. The other SCBs, labeled 45, can be moved. In this example, there is a 10×10 grid and a rule that an SCB can be moved by only one step vertically or horizontally. Possible moves are indicated by the arrows.

The principle of the move is to concentrate SCBs on the same row or column, thereby providing a more compact distribution net and simplifying skew and latency.

The procedure followed is to calculate, for each row and column, the number of SCBs in that row or column, and the number that could be included within the rules. The numbers on the side and bottom indicate the actual number and potential number of SCBs in that row or column.

Figure 5:
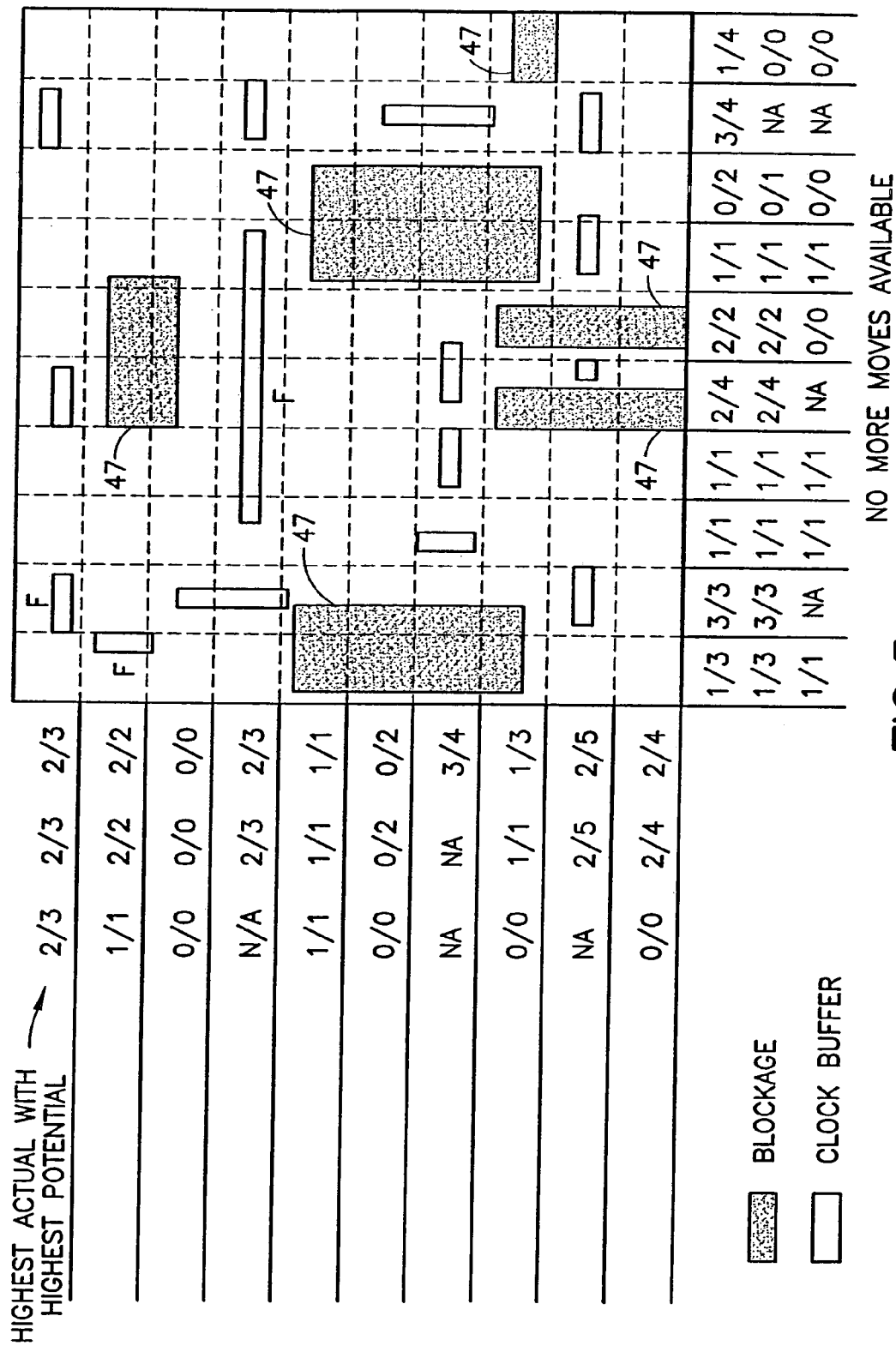

FIG. 5 shows the final configuration of SCBs after allowed moves have been made. The effect of the moves has been to concentrate the horizontal distribution in four rows, with the vertical distribution being spread more broadly.

Figure 6:
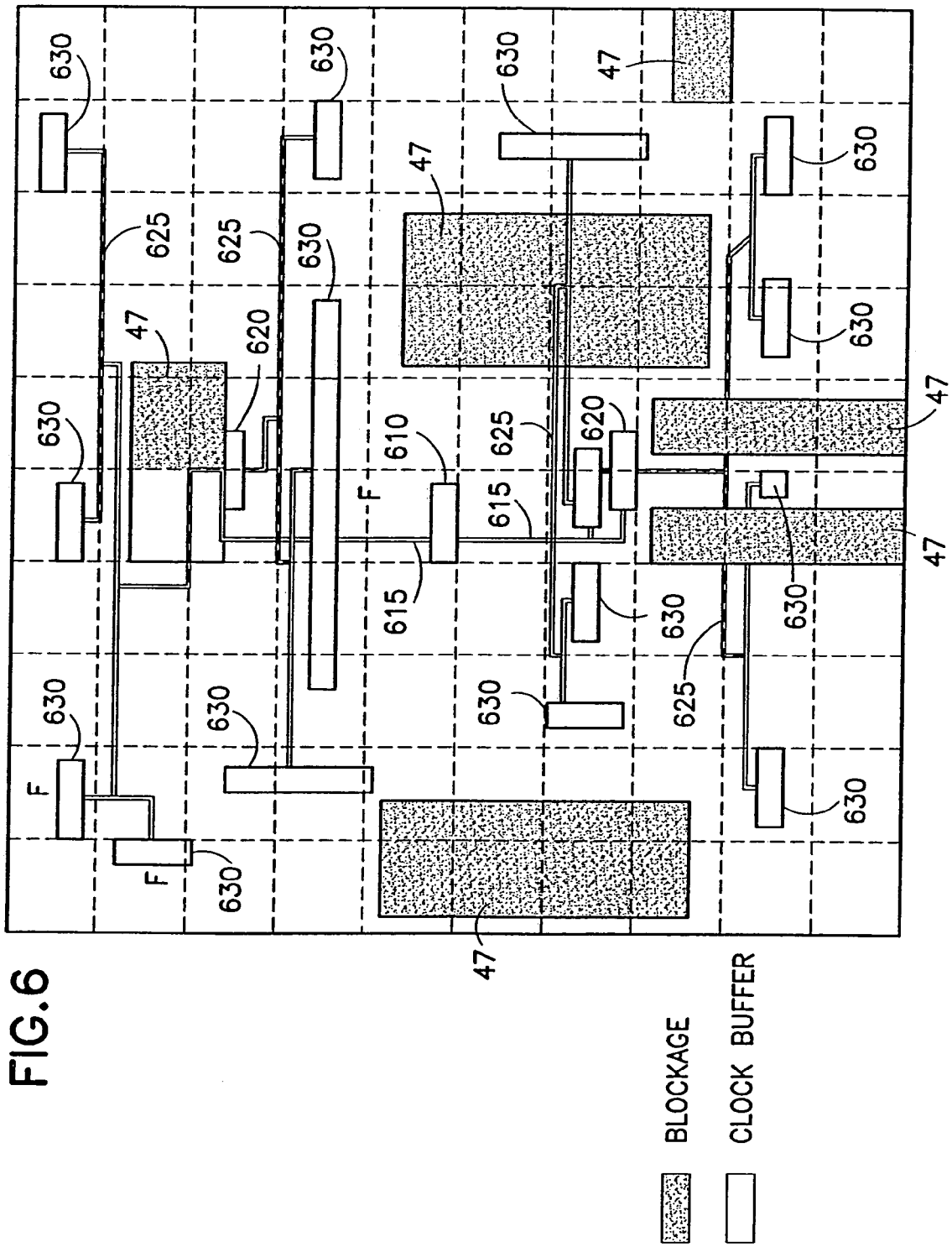
FIG. 6 shows a completed tree.

FIG. 6 shows the result of connecting the SCBs from FIG. 5. Leaf-level buffers are denoted with numeral 630. Second-level buffers are denoted with numeral 620 (located in the middle, about one third from the bottom and from the top). The root level buffer is denoted with numeral 610, located at the center. Location of the root at or near the center is not required, though it contributes to symmetry and a compact layout. The location of the source is not shown in this Figure. It will be located at a fixed position and a route constructed from it to SCB 610.

The temporary insertion point, which is used in each level of the clock tree looks at both its sink circuits (bottom of tree) and the source circuit for those sinks (top of tree).

While the invention has been described in terms of a single preferred embodiment, those skilled in the art will recognize that the invention can be practiced in various versions within the spirit and scope of the following claims.

INDUSTRIAL APPLICABILITY

The invention has applicability to the design and fabrication of integrated electronic circuits.

What is claimed is:

1. A method of designing a clock tree in an integrated circuit, comprising the steps of:
    collecting a set of sink locations in a master list and a set of blocked areas;
    (a) selecting a temporary insertion point (TIP);
    (b) enclosing a sink at a first level farthest from the TIP in a bin that includes a first subset of sinks and remove the first subset of sinks from the master list;
    (c) assigning a first-level structured clock buffer (SCB) to the bin, in which said step (c) of assigning a first-level SCB to the bin comprises the steps of attempting to place a horizontal SCB, then attempting to place a vertical SCB in a central location when a horizontal SCB will not fit in said central location;
    repeating steps (a), (b) and (c) above for the remaining sinks in the first level of buffers and subsequent levels until a root level is reached;
    improving the symmetry of the tree by moving the SCB locations within constraints to concentrate SCBs in rows and columns;
    connecting the root level TIP to lower levels; and
    connecting a source (S) of clock signals to the root level TIP.

2. The method as claimed in claim 1, in which said step (a) of selecting a TIP comprises calculating a center of sinks and a centroid of sinks and automatically placing said TIP at one of said center, centroid or an intermediate point between said center and centroid in accordance with an algorithm that locates available space.

3. The method as claimed in claim 1, in which said step (a) of selecting a TIP comprises calculating a center of sinks and a centroid of sinks and automatically placing said TIP at one of said center, centroid or an intermediate point between said center and centroid in accordance with an algorithm that locates and selectively weights one or more of delay, power consumed and placability.

4. The method as claimed in claim 1, in which said vertical SCB comprises a set of circuit elements said out to have substantially the same delay as a corresponding SCB with horizontal layout.

5. The method as claimed in claim 1, in which said step of improving the symmetry comprises a step of calculating for each of a set of columns and rows a potential improvement in symmetry of SCBs in an nth level of said tree and moving SCBs to improve symmetry.

6. The method as claimed in claim 5, in which some designated SCBs are excluded from the calculation in said step of improving the symmetry, whereby only a subset of SCBs is included in the calculation.

7. The method as claimed in claim 5, in which the amount of movement permitted to improve symmetry is restricted to a preset amount.

8. The method as claimed in claim 1, in which said SCB assigned to a subset of sinks is selected from a set of predesigned SCBs of varying capacity.

* * * * *